United States Patent [19]

Blaisdell et al.

[11] 3,992,652

[45] Nov. 16, 1976

[54] BULK ELECTRICAL SURGE ARRESTER

[75] Inventors: Leonard L. Blaisdell, Medway; Normand E. Tetreault, Foxboro, both of Mass.

[73] Assignee: GTE Sylvania Incorporated, Stamford, Conn.

[22] Filed: Sept. 9, 1974

[21] Appl. No.: 504,547

[52] U.S. Cl. .................... 317/61.5; 317/68; 317/62; 317/99; 339/14 R; 339/193 P

[51] Int. Cl.[2] .................... H02H 3/22; H05K 7/04

[58] Field of Search .................... 317/61, 61.5, 62, 69, 317/67, 68, 16, 99, 101; 174/51; 339/14 R, 14 P, 143 R, 143 T, 177 R; 333/79

[56] References Cited

UNITED STATES PATENTS

| | | | |
|---|---|---|---|
| 3,002,162 | 9/1961 | Garstang | 333/79 |
| 3,136,592 | 6/1964 | Miller | 339/177 R |
| 3,435,387 | 3/1969 | Reinke et al. | 333/79 |
| 3,626,237 | 12/1971 | Bolton | 317/61 |
| 3,702,420 | 11/1972 | Cooper | 317/62 X |
| 3,778,752 | 12/1973 | Noyes | 339/147 R |
| 3,790,858 | 2/1974 | Brancaleone et al. | 339/14 R |
| 3,867,670 | 2/1975 | Schor et al. | 317/61.5 |

*Primary Examiner*—J. D. Miller
*Assistant Examiner*—Patrick R. Salce
*Attorney, Agent, or Firm*—David M. Keay; Elmer J. Nealon; Norman J. O'Malley

[57] ABSTRACT

A two-part electrical surge arrester for protecting electrical equipment within a shielded enclosure from electromagnetic pulses and lighting on incoming lines. One part mounted on the exterior of the enclosure wall includes a chamber having fifty-five spark gaps employing a common ground plane. The second part mounted on the interior of the enclosure wall contains fifty-five current limiting resistors and fifty-five low pass filters. When both parts are mounted on opposite sides of the enclosure wall contacts from each engage through an opening in the wall to provide fifty-five protective paths between incoming lines and equipment within the enclosure.

9 Claims, 6 Drawing Figures

BULK ELECTRICAL SURGE ARRESTER

BACKGROUND OF THE INVENTION

This invention relates to electrical surge arresters. More particularly, it is concerned with electrical surge arresters for protecting electrical equipment having a large number of incoming lines from electrical transients caused by lightning or electromagnetic pulses on the lines.

It is frequently necessary to protect the electrical equipment of a communications system having a large number of incoming communication lines from electromagnetic pulses and lightning. Commonly, the equipment is placed in a shielded enclosure or shelter and a spark gap for shorting high voltage pulses to ground is provided on each incoming line at its point of entry into the equipment enclosure. In order to protect the equipment form an initial surge which might pass before the spark gap fires, a current limiting resistor and a low pass filter may be connected in each line, typically at the individual item of equipment to which the line is connected.

Although such arrangements are widely used for providing electrical surge protection, they do present some problems. In installations having a very large number of lines entering an equipment enclosure, close coupling between the lines leading into and out of a spark gap may have the effect of partially short-circuiting the spark gap protection reducing its effectiveness. Locating the spark gaps at the point of entry into the equipment enclosure and placing the additional protective elements within the individual items of equipment permits high voltage transients to enter the enclosure. These transients are difficult to control once they enter the enclosure and may be coupled to other wiring and be distributed throughout the equipment, causing either system malfunctions or damage.

Maintenance of a large number of lines and their associated spark gaps is difficult since the usual preventive maintenance entails visual inspection of each individual spark gap. Furthermore, since the spark gaps are located at the point of entry into the enclosure, removing and replacing one may temporarily violate the integrity of the electomagnetic shielding of the enclosure. In addition, conventional arrangement of spark gaps and associated protective elements require a considerable amount of space which increases in proportion to the number of lines which must be protected.

SUMMARY OF THE INVENTION

A bulk electrical surge arrester in accordance with the present invention provides improved protection for equipment within a shielded enclosure from electromagnetic pulses and lightning on incoming lines. The bulk electrical surge arrester includes a housing member having closure members at its opposite ends to provide an enclosed chamber. A plurality of conductive leads which are electrically isolated from each other and lie generally parallel to each other are arranged with an interior portion of each within the chamber, with a first exterior portion of each extending through one of the closure members to the exterior of the chamber, and with a second exterior portion of each extending through the other of said closure members to the exterior of the chamber. A conductive ground plane member is mounted within the chamber and lies generally transverse to the conductive leads. Each of the leads passes through a different opening in the ground plane member and is spaced from the ground plane member by a sleeve of insulating material. This arrangement provides a spark gap between each of the leads and the ground plane member.

The arrester also includes a like plurality of resistive elements which are mounted fixed with respect to each other. One end of each resistive element is in electrical connection with the second exterior portion of a different one of the conductive leads. A like plurality of contact members are mounted fixed with respect to each other and electrically insulated from each other. Each of these contact members has contact surfaces at one end. A like plurality of low pass filter means are mounted fixed with respect to each other. Each filter means is connected between the other end of a different one of the resistive elements and a different one of the contact members.

BRIEF DESCRIPTION OF THE DRAWINGS

Additional objects, features, and advantages of bulk electrical surge arresters in accordance with the present invention will be apparent from the following detailed discussion together with the accompanying drawings wherein.

DETAILED DESCRIPTION OF THE INVENTION

Figure 1:
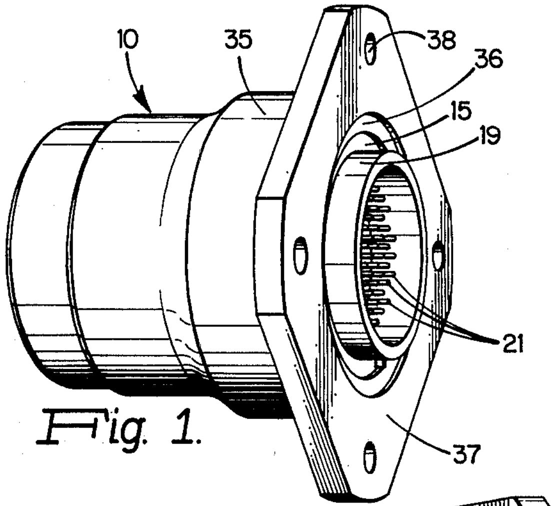
FIG. 1 is a perspective view of a first part of a two-part bulk electrical surge arrester in accordance with the present invention.

The bulk electrical surge arrester in accordance with the present invention as illustrated in the drawings provides protection for fifty-five incoming lines to a shielded enclosure. The device as shown includes two parts or assemblies 10 and 11 which are mounted on opposite sides of the wall 13 of a shielded enclosure so as to engage each other through an opening 14 in the wall as illustrated in FIG. 4.

Figure 2:
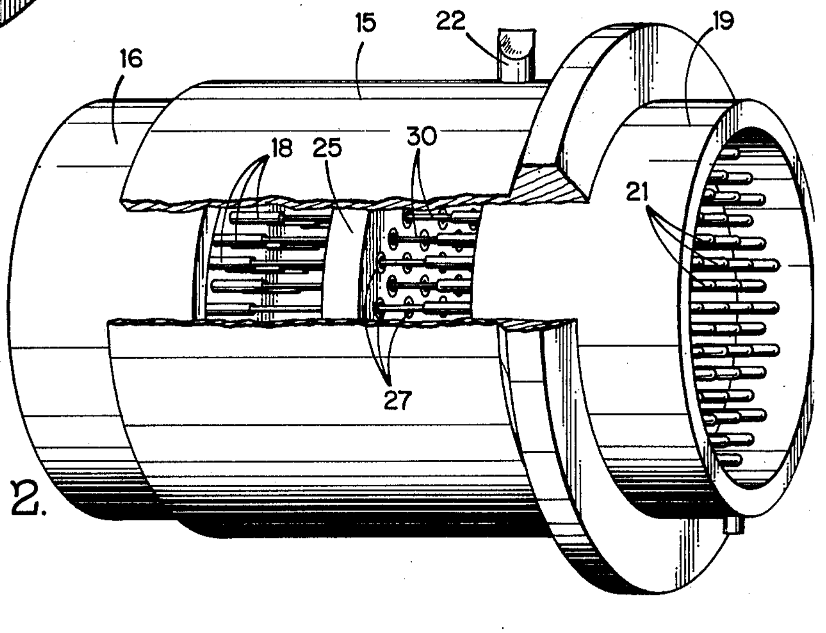
FIG. 2 is a perspective view of a sub-assembly of the first part of the electrical surge arrester shown in FIG. 1.
Figure 4:
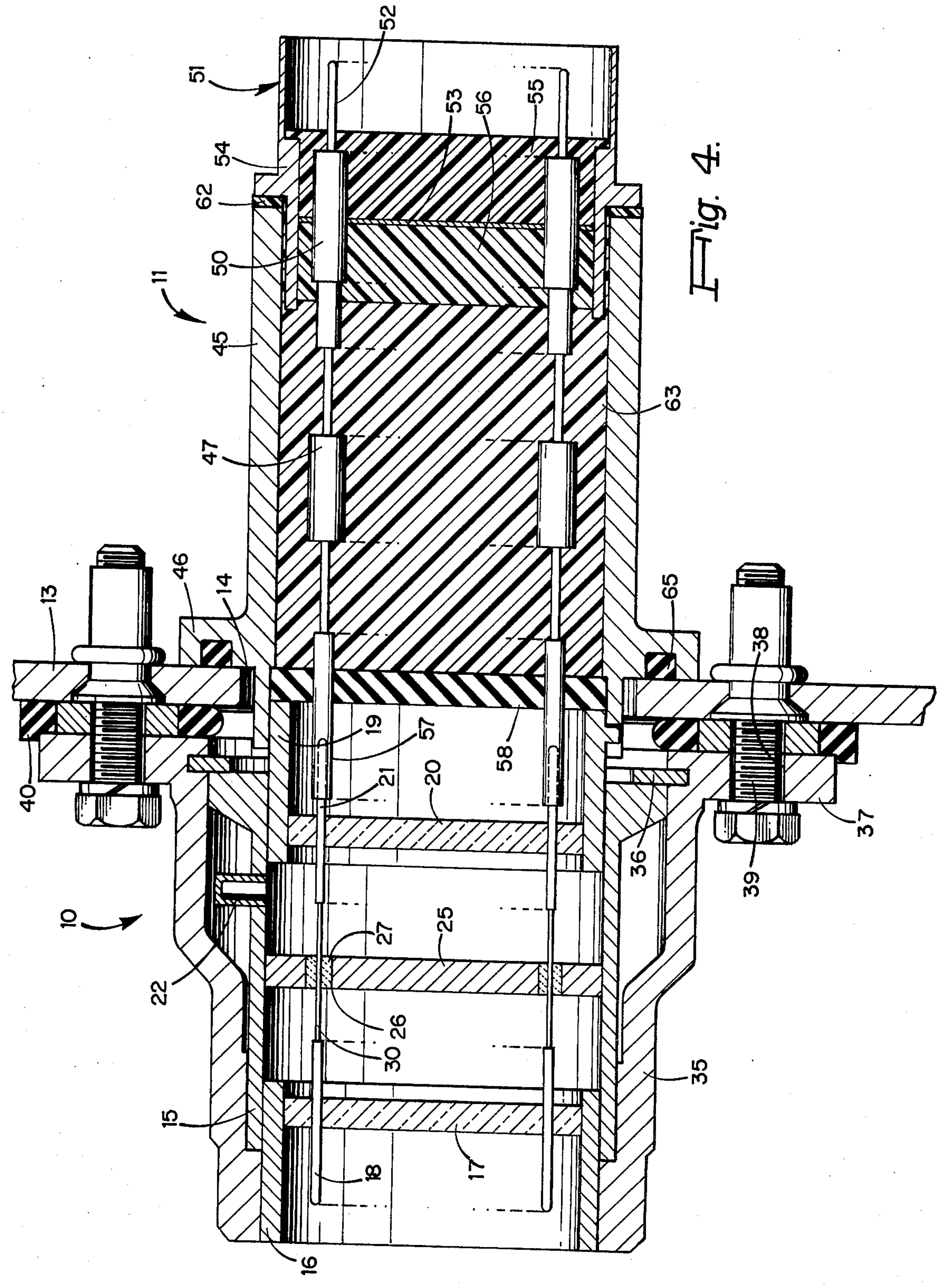
FIG. 4 is a cross-sectional view of a two-part electrical surge arrester with the two parts shown in FIGS. 1 and 3 mounted in operating position on opposite sides of an enclosure wall.

The first part 10 of the arrester includes a cylindrical housing 15 of conductive material as shown in FIGS. 2 and 4. A standard 55-pin connector assembly including a conductive cylinder 16, an insulating disc 17, and fifty-five contact pins 18 (only two are shown in FIG. 4) is mounted at one end of the housing 15. A similar standard connector assembly including a conductive cylinder 19, an insulating disc 20, and fifty-five contact pins 21 is mounted at the opposite end of the housing 15. The connector assemblies close the ends of the housing and together therewith form a sealed chamber. The chamber is evacuated through an exhaust tubulation 22 which is sealed after a suitable fill has been placed in the chamber as will be explained hereinbelow.

A conductive ground plane 25 is mounted within the chamber transverse to the axis of the cylindrical housing 15. Spaced throughout the ground plane 25 is an arrangement of fifty-five openings 26 in the same pattern as the contact pins 18 and 21. Each opening 26 contains a sleeve 27 of insulating material, for example glass or ceramic, which encircles and supports a lead wire 30. The opposite ends of each lead wire 30 are connected to contact pins 18 and 21 so as to form straight conductive leads which pass through the chamber to the exterior of the chamber at its opposite ends. The arrangement of each lead wire 30 and insulating sleeve 27 with the ground plane 25 provides a spark gap between each of the conductive leads and the ground plane 25.

The sub-assembly as illustrated in FIG. 2 is fabricated in the following manner. The wires 30 and insulating sleeves 27 are mounted in the openings of the ground plane 25. The ends of the wires 30 are connected to the pins 18 and 21 of the standard connector assemblies. This unit is placed in the cylindrical housing 15 and the cylindrical members 16 and 19 are sealed to the opposite ends of the housing in a hermetic metal-to-metal seal. The ground plane 25 is also fixed in conductive relationship to the housing during the sealing operation. The sealed chamber of the resulting sub-assembly is evacuated through the tubulation 22, an appropriate fill is placed in the chamber, and then the tubulation is sealed.

To provide additional protection from mechanical shock and to permit attachment to an enclosure wall, the sub-assembly of FIG. 2 as described in placed within a cylindrical mounting member 35 and held therein by a retaining ring 36 as shown in FIGS. 1 and 4. The mounting member 35 includes a flange 37 with openings 38 for receiving fasteners 39 for movably securing the first assembly to the wall 13 of the enclosure. A protective gasket 40 is positioned between the surface of the flange 37 of the mounting member 35 and the surface of the wall 13 of the enclosure. The gasket provides protection from the weather and also shielding from electromagnetic radiation.

Figure 3:
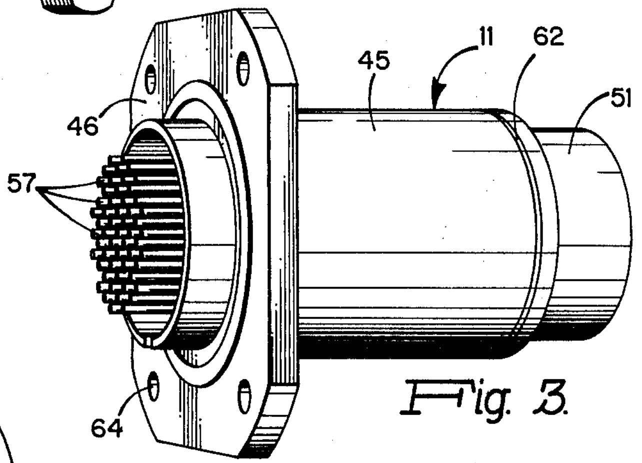
FIG. 3 is a perspective view of a second part of a two-part bulk electrical surge arrester in accordance with the present invention.

The second part of assembly 11 of the electrical surge arrester is illustrated in FIGS. 3 and 4. It includes a cylindrical housing member 45 having a flange 46 which permits removably mounting the second assembly on the interior of the enclosure wall 13. Located within the housing member 45 are fifty-five resistors 47 and fifty-five low pass filters 50.

The fifty-five filters 50 are incorporated in a commercially available filter connector assembly 51 having an arrangement of fifty-five contact pins 52 for engaging a standard connector assembly. Each filter includes a central conductor encircled by a ferrite material to provide resistance and inductance along its length. Capacitance is provided between the ferrite material and conductive surfaces on the filter. A ground plane 53 connects the conductive surface of each filter to the conductive cylindrical shell 54 of the filter connector. The filters 50 and ground plane 53 are supported within the shell 54 by insulators 55 and 56. One end of each resistor 47 is connected to one of the filters 50. The other end of each resistor 50 is connected to an electrical connector 57. The fifty-five electrical connectors 57 are supported in the proper pattern by an insulating disc 58 so as to be able to engage the contact pins 21 of the first assembly 10.

The second part 11 of the arrester is fabricated by attaching one lead of each resistor 47 to the conductor of a filter 50 and the other lead to one of the conductive leads 57. This unit is placed in the cylindrical housing 45 with a gasket 62 which provides shielding from electromagnetic interference between the housing and the shell 54 of the filter connector 51 and grounds the shell 54. The housing is filled with potting compound 63 and the insulating disc 58 is placed in position. The potting compound 63 hardens to form a mass of insulating material which supports the elements within the housing and also provides for dissipating heat from the resistors.

The second part 11 of the arrester is removably mounted on the interior of the enclosure wall 13 by suitable fasteners (not shown) passing through openings 64 in the flange 46 of the housing 45. The pattern of the openings 64 and fasteners in such that there is no interference with the fasteners 39 holding the first assembly 10 on the other side of the wall. A gasket 65 to prevent leaking of electromagnetic radiation is located between the flange 46 and the enclosure wall.

Under operating conditions as illustrated in FIG. 4 the first assembly 10 is mounted against the exterior surface of an enclosure wall 13 with the contact surfaces of the contact pins 21 accessible through the opening 14 in the wall. Similarly, the second assembly 11 is mounted against the interior surface of the enclosure wall 13 with the contact surfaces of the connectors 57 accessible through the opening 14 in the wall. With both assemblies mounted in position, the contact surfaces of the pins 21 and connectors 57 engage as shown. Up to fifty-five incoming lines may be grouped together by a suitable standard connector which mates with the contact pins 18. Similarly, fifty-five lines to equipment within the enclosure may be grouped together by a suitable standard connector which mates with the contact pins 52 of the filter connector 51. Thus, the two-part surge arrester provides a spark gap, a current limiting resistor, and a low pass filter in series for each of fifty-five lines. All of the elements of the surge arrester are within a single two-part device which is mounted at the point of entry of the lines into a shielded equipment enclosure.

The electrical elements of each path through the surge arrester as described operate to protect the equipment connected to the path. A high voltage pulse on an incoming line is shorted across the associated spark gap to the ground plane 25. Any initial transients passed by the spark gap before it fires are dissipated by the current limiting resistor 47 and blocked by the low pass filter 50.

A specific embodiment of a bulk electrical surge arrester in accordance with the invention has been fabricated with protective paths for fifty-five lines. The spark gaps employ wires 30 of 0.50 inch in diameter and insulating sleeves of barium titanate loaded epoxy 0.080 inch in diameter. The spark gap chamber was filled to a pressure of 12 millimeters of mercury with a mixture of argon and 1 millicurie of radio-active tritium for radioactive prompting. The resistors 47 were 22 ohm, one-fourth watt resistors and were potted in a potting compound designated Castall No. 301 produced by Castall Inc. of Weymouth, Mass. The filter connector assembly was an ITT Cannon type KPJ connector having a 1 MHz cut off frequency.

The following table summarizes results obtained from testing the specific device as described by applying voltage pulses with different rates-of-rise at an input control pin 18. The output contact pin 52 was left open-circuited. If the output has been terminated in a load rather than an open circuit, the output voltage would have been further reduced by a voltage drop in the current limiting resistor.

| Rate of Rise of Applied Pulse | Firing Voltage of Spark Gap | Open-Circuit Output Voltage |
|---|---|---|
| 1 V/μs | 400 v | 360 v |
| 11 V/μs | 520 v | 500 v |
| 600 V/μs | 580 v | 560 v |
| 800 V/μs | 610 v | 590 v |
| 1 KV/μs | 600 v | 540 v |
| 25 KV/μs | 1100 v | 390 v |
| 60 KV/μs | 1600 v | 260 v |
| 175 KV/μs | 2000 v | 100 v |
| 200 KV/μs | 2000 v | 50 v |

Figure 6:
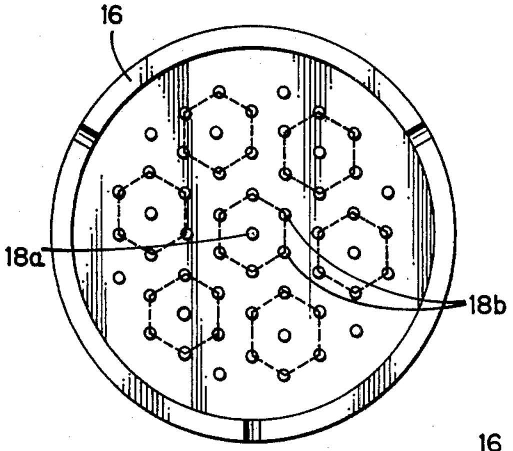
FIG. 6 is a representation of an end view of the modified electrical surge arrester of FIG. 5 indicating the grouping of contact members as employed in the modification.
Figure 5:
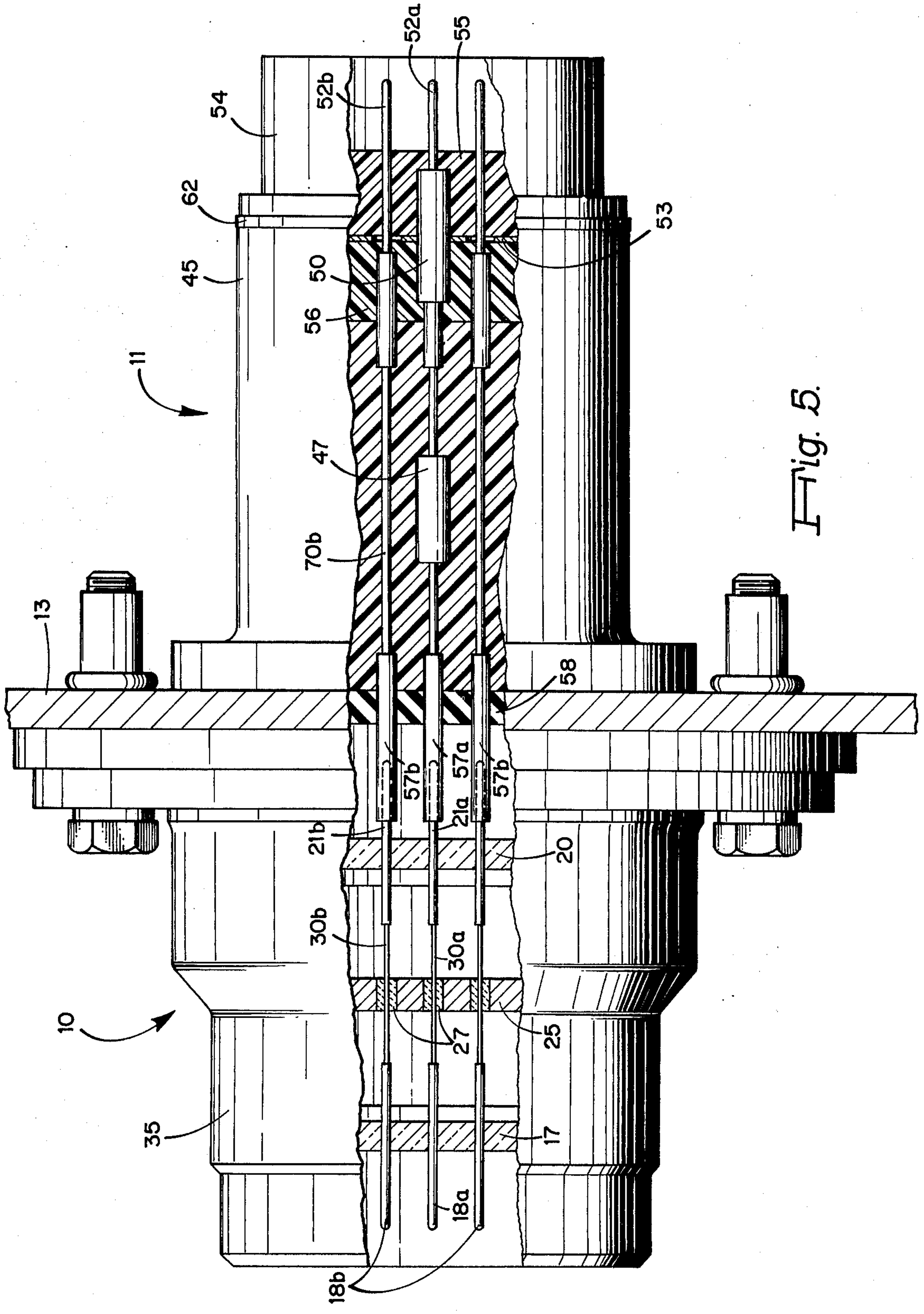
FIG. 5 is a side elevational view of a modified two-part electrical surge arrester in accordance with the present invention shown with the two parts connected together and with portions removed.

A modification of the electrical surge arrester as described which is specifically suited for providing protection on coaxial lines is shown in FIGS. 5 and 6. As indicated by the phantom lines of FIG. 6, the paths through the device are formed into groups of seven with one central path encircled by a pattern of six surrounding paths, illustrated by contact pins 18*a* and 18*b*, respectively.

In FIG. 5, the device is cut away to show one central path and two of the encircling paths. A central path includes a contact pin 18*a*, a lead wire 30*a*, and a contact pin 21*a* in the first part 10 of the device, and an electrical connector 57*a*, a resistor 47, a low pass filter 50, and a contact pin 52*a* in the second part 11. A spark gap is provided in the first part by the arrangement of a ground plane member 25 and insulating sleeve 27 between the lead wire 30*a* and the ground plane member 25. Thus, each central path of a group through the device is identical to those previously described in the embodiment of FIGS. 1–4.

Each of the encircling paths includes a contact pin 18*b*, a lead wire 30*b*, and a contact pin 21*b* in the first part 10. A spark gap may also be provided between each of the lead wires 30*b* and the ground plane member 25 as shown in FIG. 5. In the second part of the device an electrical connector 57*b* is connector by a lead wire 70*b* in a direct electrical connection to a contact pin 52*b*.

In operation a coaxial line is connected to a connector for mating with the contact pins 18 so that the central pin 18*a* of a group is connected to the central conductor of the coaxial line and the six encircling pins 18*b* are connected to the outer conductor or shield of the coaxial line. Similarly, a coaxial line is connected to another connector for mating with the contact pins 52 so that the central pin 52*a* of a group is connected to the central conductor of the coaxial line and the six encircling contact pins 52*b* are connected to the outer conductor of the coaxial line.

A bulk electrical surge arrester as described isolates lines leading into the arrester to the exterior of the enclosure and lines leading away from the arrester to the interior of the enclosure. Thus, there is no coupling between them. Since all the elements of the arrester are located at the point of entry, no high voltage transients exist at any point within the enclosure.

Maintenance problems are greatly reduced by employing the device of the invention. Since the fifty-five spark gaps are positioned within a single chamber their firing characteristics are essentially the same. Therefore, all of the spark gaps can be tested by conducting a breakdown test on any one. One of the fifty-five paths through the device may be reserved for this purpose. In addition, since the fifth-five sparks gaps are in a single chamber, under operating conditions the firing of one spark gap stimulates the others to five more readily thus providing increased protection. The two-part arrangement of the device permits removal and replacement of either part separately without violating the shielded integrity of the enclosure. Under certain conditions when it is important to prevent the escape of any radiation from an enclosure this feature may be very significant.

While there has been shown and described what are considered preferred embodiments of the present invention it will be obvious to those skilled in the art that various changes and modifications may be made therein without departing from the invention as defined by the appended claims.

What is claimed is:

1. A bulk electrical surge arrester comprising a housing member;

closure members mounted at opposite ends of said housing member forming therewith an enclosed chamber;

a plurality of conductive leads electrically insulated from each other and lying generally parallel to each other, said conductive leads each having an interior portion disposed within said chamber, a first exterior portion extending through one of said closure members to the exterior of said chamber, and a second exterior portion extending through the other of said closure members to the exterior of said chamber;

a conductive ground plane member mounted within said chamber generally transverse to the conductive leads;

each of said conductive leads passing through a different opening in said ground plane member and being spaced therefrom by insulating material whereby a spark gap is formed between each of said conductive leads and the ground plane member;

a like plurality of resistive elements mounted fixed with respect to each other, each having one end in electrical connection with the second exterior portion of a different one of said conductive leads;

a like plurality of contact members mounted fixed with respect to each other and electrically insulated from each other, each of said contact members having contact surfaces at one end; and a like plurality of low pass filter means mounted fixed with respect to each other, each being connected between the other end of a different one of said resistive elements and a different one of said contact members.

2. A two-part electrical surge arrester comprising a first assembly including a first housing member;

closure members mounted at opposite ends of said first housing member forming therewith an enclosed chamber;

a plurality of conductive leads electrically insulated from each other and lying generally parallel to each other, said conductive leads each having an interior portion disposed within said chamber, a first exterior portion extending through one of said closure members to the exterior of said chamber, and a second exterior portion extending through the other of said closure members to the exterior of said chamber, each first and second exterior portion having contact surfaces;

a conductive ground plane member mounted within said chamber generally transverse to the conductive leads; and each of said conductive leads passing through a different opening in said ground plane member and being spaced therefrom by insulating material whereby a spark gap is formed between each of said conductive leads and the ground plane member; and a second assembly including a second housing member;

a like plurality of electrical connectors mounted fixed in said second housing adjacent to one end thereof and electrically insulated from each other, each electrical connector having a portion disposed within said second housing and a portion with contact surfaces disposed externally of the second housing, said contact surfaces being adapted to engage the contact surfaces of said second exterior portions of the conductive leads of the first assembly;

a like plurality of resistive elements mounted fixed within said second housing, each having one end connected to said portion of a different one of said electrical connectors which is disposed within the second housing;

a like plurality of contact members fixed in said second housing and electrically insulated from each other, each of said contact members having contact surfaces at one end disposed externally of the second housing adjacent to the opposite ene thereof; and a like plurality of low pass filter means mounted fixed in said second housing, each being connected between the other end of a different resistive element and a different one of said contact members.

3. A two-part electrical surge arrester in accordance with claim 2 wherein said first assembly includes a first mounting means adapted for removably mounting the first assembly against one surface of an enclosure wall having an opening therethrough with the contact surfaces of said second exterior portions of the conductive leads accessible through said opening;

said second assembly includes a second mounting means adapted for removably mounting the second assembly against the opposite surface of said enclosure wall with the contact surfaces of said portions of the electrical connectors accessible through said opening;

whereby the contact surfaces of said second exterior portions of the conductive leads and the contact surfaces of said portions of the electrical connectors engage each other through the opening in the enclosure wall when both the first and second assemblies are mounted on the opposed surfaces of the enclosure wall.

4. A two-part electrical surge arrestor in accordance with claim 3 wherein said first housing member and said closure members form a sealed chamber; and said sealed chamber contains a radioactive fill.

5. A two-part electrical surge arrester in accordance with claim 4 wherein said first housing member is a cylindrical conductive member;

said closure members each include a disc of insulating material disposed transverse to the axis of the cylindrical conductive member;

said conductive leads lie generally parallel to the axis of the cylindrical member;

said conductive ground plane member includes a conductive disc having an outside diameter approximately equal to the inside diameter of the cylindrical conductive member and its periphery is fixed in conductive relationship with the cylindrical conductive member;

each of said conductive leads passes through a different opening in said conductive disc; and a sleeve of insulating material is disposed within each of said openings in the conductive disc and encircles the conductive lead passing therethrough.

6. A two-part electrical surge arrester in accordance with claim 5 including insulating potting material within said second housing member surrounding said resistive elements and supporting them fixed in the second housing.

7. An electrical surge arrester comprising a housing member;

closure members mounted at opposite ends of said housing member forming therewith an enclosed chamber;

a group of conductive leads lying generally parallel to each other, one of the leads of the group being encircled by the other leads of the group, said conductive leads each having an interior portion disposed within said chamber, a first exterior portion extending through one of said closure members to the exterior of said chamber, and a second exterior portion extending through the other of said closure members to the exterior of said chamber;

a conductive ground plane member mounted within said chamber generally transverse to the conductive leads;

said one of the conductive leads passing through an opening in said ground plane member and being spaced therefrom by insulating material whereby a spark gap is formed between said one conductive lead and the ground plane member;

a resistive element having one end in electrical connection with the second exterior portion of said one conductive lead;

a group of contact members mounted fixed with respect to each other, one of the contact members of the group being encircled by the other contact members of the group, each of said contact members having contact surfaces at one end;

a low pass filter means connected between the other end of said resistive element and said one contact member; and direct electrical connections between the second exterior portions of said other conductive leads of the group of conductive leads and the other contact members of the group of contact members.

8. A two-part electrical surge arrester comprising a first assembly including a first housing member;

closure members mounted at opposite ends of said first housing member forming therewith an enclosed chamber;

a group of conductive leads lying generally parallel to each other, one of the leads of the group being encircled by the other leads of the group, said conductive leads each having an interior portion disposed withinsaid chamber, a first exterior portion extending through one of said closure members to the exterior of said chamber, and a second exterior portion extending through the other of said closure members to the exterior of said chamber;

a conductive ground plane member mounted within said chamber generally transverse to the conductive leads;

said one of the conductive leads passing through an opening in said ground plane member and being spaced therefrom by insulating material whereby a spark gap is formed between said one conductive lead and the ground plane member;

a second assembly including a second housing member;

a group of electrical connectors mounted fixed in said second housing adjacent to one end thereof, one of the electrical connectors of the group being encircled by the other electrical connectors of the group, each electrical connector having a portion disposed within said second housing and a portion with contact surfaces disposed externally of the second housing, said contact surfaces being adapted to engage the contact surfaces of said second exterior portions of the conductive leads of the first assembly;

a resistive element mounted fixed within said second housing and having one end connected to the portion of said one of the electrical connectors which is disposed within the second housing;

a group of contact members mounted fixed in said second housing, one of the contact members of the group being encircled by the other contact members of the group, each of said contact members having contact surfaces at one end disposed externally of the second housing adjacent to the opposite end thereof;

a low pass filter means mounted fixed in said second housing and connected between the other end of said resistive element and said one contact member; and direct electrical connections between the portions of the other of the electrical connectors which are disposed within the second housing and the other contact members of the group of contact members.

9. A two-part electrical surge arrester in accordance with claim 8 wherein said first assembly includes a first mounting means adapted for removably mounting the first assembly against one surface of an enclosure wall having an opening therethrough with the contact surfaces of said second exterior portions of the conductive leads accessible through said opening;

said second assembly includes a second mounting means adapted for removably mounting the second assembly against the opposite surface of said enclosure wall with the contact surfaces of said portions of the electrical connectors accessible through said opening;

whereby the contact surfaces of said second exterior portions of the conductive leads and the contact surfaces of said portions of the electrical connectors engage each other through the opening in the enclosure wall when both the first and second assemblies are mounted on the opposed surfaces of the enclosure wall.

* * * * *